United States Patent [19]

Murakami et al.

[11] Patent Number: 5,767,536

[45] Date of Patent: Jun. 16, 1998

[54] II-VI GROUP COMPOUND SEMICONDUCTOR DEVICE

[75] Inventors: Masanori Murakami; Yasuo Koide, both of Kyoto; Nobuaki Teraguchi; Yoshitaka Tomomura, both of Nara, all of Japan

[73] Assignee: Sharp Kabushiki Kaisha, Osaka, Japan

[21] Appl. No.: 756,192

[22] Filed: Nov. 25, 1996

Related U.S. Application Data

[63] Continuation of Ser. No. 410,522, Mar. 23, 1995, abandoned.

[30] Foreign Application Priority Data

Mar. 24, 1994 [JP] Japan ................... 6-053589

[51] Int. Cl.$^6$ ........................ H01L 33/00
[52] U.S. Cl. ............ 257/99; 257/103; 257/743; 257/744; 257/201; 257/614
[58] Field of Search ............ 257/99, 734, 743, 257/744, 200, 201, 103, 614; 372/43, 45, 46

[56] References Cited

U.S. PATENT DOCUMENTS 5,373,175 12/1994 Ozawa et al. ............... 257/99

FOREIGN PATENT DOCUMENTS

| 0 552 023 | 7/1993 | European Pat. Off. ....... 257/201 |
| 0 569 094 | 11/1993 | European Pat. Off. |
| 0 594 212 | 4/1994 | European Pat. Off. |
| 5-259509 | 10/1993 | Japan ....................... 257/201 |
| 92/21170 | 11/1992 | WIPO |
| 94/15369 | 7/1994 | WIPO |

OTHER PUBLICATIONS

Ohtsuka, T., et al. "Growth and Characterization of p-type CdSe," *Preliminary Drafts of Lecture,* (1993), vol. 1, (presented at the 54th Conference on Applied Physics, Scientific Lecture Meeting) (English translation attached).

Jeon, H., et al. "Blue-green injection laser diodes in (Zn, Cd)Se/ZnSe quantum wells," *Appl. Phys. Lett.,* (1991), 59(27):3619-21.

Haase, M.A., et al. "Blue-green laser diodes," *Appl. Phys. Lett.,* (1991), 59(11):1272-74.

Haase, M. et al. "Short wavelength II-VI laser diodes," *Inst. Phys. Conf. Ser.,* (1991), No. 120: Chap. 1, pp. 9-16 (paper presented at Int. Symp. GaAs and Related Compounds, Seattle).

Lansari, Y., et al. Improved ohmic contacts for p-type ZnSe and related p-on-n diode structures, *Appl. Phys. Lett.,* (1992), 61(21):2554-56.

Fan, Y., et al., "Graded band gap ohmic contact to p-ZnSe," *Appl. Phys. Lett.,* (1992), 61(26):3160-62.

Hiei, F., et al. "Ohmic contacts to p-type ZnSe using ZnTe/ZnSe multiquantum wells," *Electronic Letters,* (1993), 29(10):878-79.

*Primary Examiner*—Minh-Loan Tran
*Attorney, Agent, or Firm*—Morrison & Foerster LLP

[57] ABSTRACT

A II-VI group compound semiconductor device comprising a $Zn_xMg_{1-x}S_ySe_{1-y}$ ($0 \leq X \leq 1$, $0 \leq Y \leq 1$) semiconductor layer, an intermediate layer comprising a compound of an element constituting the semiconductor layer and an additive element of Cd, Te or Hg formed on the semiconductor layer, and an electrode layer containing Ni, Pt or Pd formed on the intermediate layer.

20 Claims, 9 Drawing Sheets

Fig. 10A Intermediate layer is not formed
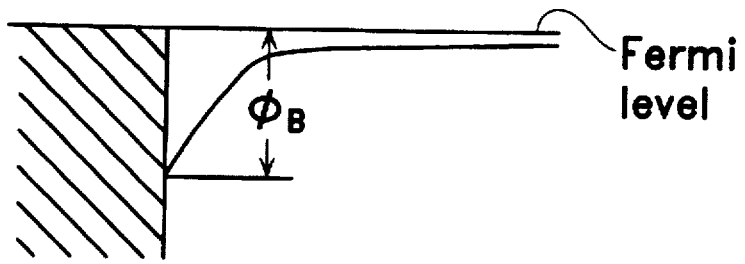
Fig. 10B Intermediate layer having uniform concentration
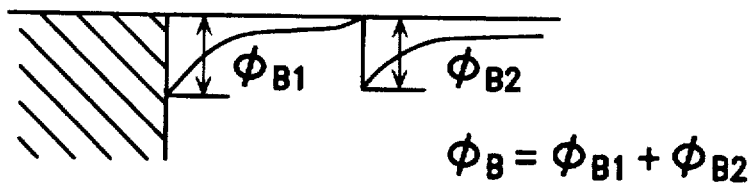
$\phi_B = \phi_{B1} + \phi_{B2}$
Fig. 10C Intermediate layer having graded concentration
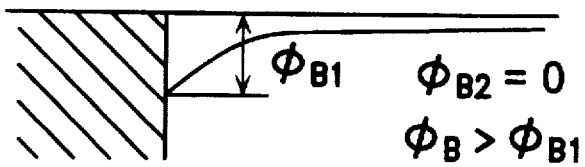
$\phi_{B2} = 0$
$\phi_B > \phi_{B1}$
Fig. 10D Before junction
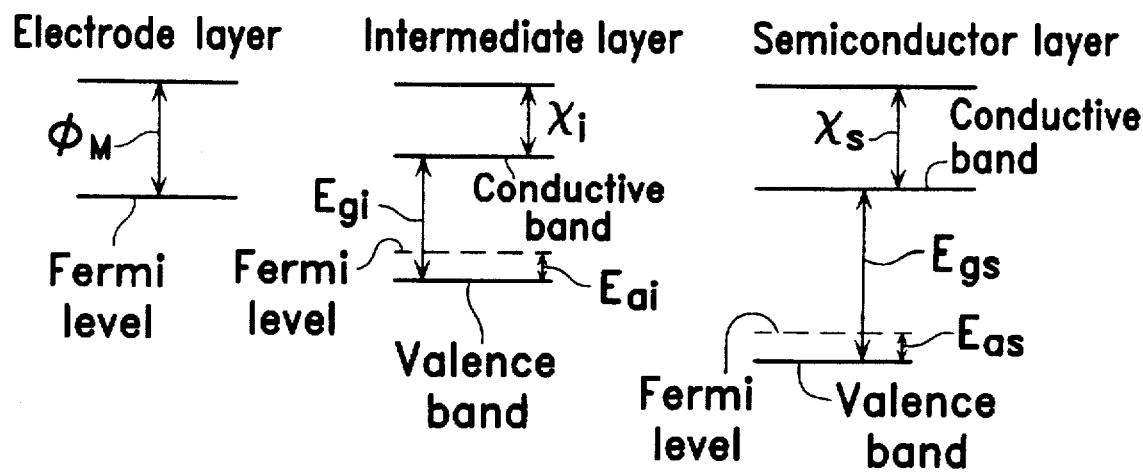

II-VI GROUP COMPOUND SEMICONDUCTOR DEVICE

This application is a file wrapper continuation of application Ser. No. 08/410,522, filed Mar. 23, 1995, now abandoned.

BACKGROUND OF THE INVENTION

1. Field of the Invention

The present invention pertains to a II-VI group compound semiconductor device, and a method for manufacturing the same. More particularly it pertains to a II-VI group compound semiconductor device having an electrode which shows small contact resistance, and enables an ohmic contact between an electrode and a semiconductor layer, and a method for manufacturing the same.

2. Description of the Related Arts

So far various types of electrodes for a II-VI group compound semiconductor device have been studied. Haase et al., for example, have examined the applicability of Li, Na, Mg, Ti, Cr, Mn, Ni, Pd, Pt, Cu, Ag, Zn, Hg, Al, In, Sn, Pb, Sb, or Bi and alloys thereof as electrode materials ("Short wavelength II-VI laser diodes", Inst. Phys. Conf. Ser. No.120 P.9). However, electrode materials which provide ohmic contacts for II-VI group compound semiconductors have not yet been found.

Thus, Au is extensively used as an electrode material, but it does not form an ohmic contact, because it rather forms a Schottky junction with approximately 1.2 eV of potential barrier to p-type ZnSe.

In order to make the ohmic contact to, for example, p-type ZnSe, following methods are considered: a low-energy-barrier intermediate layer of CdSe or HgSe is epitaxially grown between the electrode material and p-type ZnSe, or p-type ZnTe is used for a contact layer, and a p-type ZnSeTe graded composition layer or an intermediate layer of a p-type ZnSe/ZnTe strained-layer superlattice is used between the p-type ZnSe and p-type ZnTe. Otsuka et al. have demonstrated an ohmic contact of Au/p-CdSe and reported the possibility of that of Au/p-CdSe/p-ZnSe ("Growth and characterization of p-type CdSe", Otsuka et al., Extended Abstracts (the 54th) p255, The Japan Society of Applied Physics). Lansari et al. have made a good ohmic contact by growing HgSe on the p-type ZnSe as a low-contact energy barrier intermediate layer by IBE and using Au as an electrode material ("Improved ohmic contact for p-type ZnSe and related p-on-n diode", Y. Lansari et al., Appl. Phys. Lett. 61 p.2554). Fan et al. ("Graded bandgap ohmic contact to p-ZnSe", Y. Fan et al., Appl. Phys. Lett. 61 p.3160), and Hiei et al. ("Ohmic contact to p-type ZnSe using ZnTe/ZnSe multi-quantum wells", F. Hiei et al., Electronics Lett. 29 p.878) have reported the fabrication of an ohmic contact by using p-type ZnTe for the contact layer and using a p-type ZnSeTe graded composition layer or the intermediate layer of a p-type ZnSe/ZnTe strained layer superlattice between the p-type ZnSe and p-type ZnTe.

However, none of the methods of making ohmic contacts to the conventional II-VI group compound semiconductors are satisfactory. They have the problems below.

When CdSe is used, a low acceptor concentration of $1 \times 10^{17} cm^{-3}$ in CdSe makes it difficult to lower contact resistance. When HgSe is used, the sharing of the MBE apparatus used for forming other layers brings deteriorated properties of devices because of the mixing of Hg atoms into other layers. Introducing exclusive MBE apparatus to avoid intermixing of atoms will conduct lower productivity. Furthermore, HgSe has poor chemical and physical stability.

When ZnTe is used, the stress remaining in the film because of a large lattice mismatch between ZnSe and ZnTe may deteriorate the properties of devices, and it is difficult to keep ZnTe carrier concentration suitable. A large lattice mismatch between ZnSe and any of the above intermediate layers also causes strain, and the epitaxial growth lowers the productivity.

Furthermore, the Au electrode used for the above methods is inferior in mechanical strength such as adhesion.

Accordingly, research was continued to create an electrode which makes an ohmic contact to II-VI group compound diodes, especially to p-type $Zn_xMg_{1-x}S_ySe_{1-Y}$ ($0 \leq X \leq 1$, $0 \leq Y \leq 1$) semiconductors.

FIG. 9 shows an ionized impurity concentration dependence of contact resistance of a metal/p-ZnSe Schottky junction as a parameter of the potential barrier $\phi_B$ between the metal and p-type ZnSe. FIG. 8 is a band diagram illustrating the Schottky barrier width (W) at the contact interface of the metal and p-type ZnSe. $\phi_B$ is given by the formula: $\phi_B = X_s + E_g - \phi_M$, in which $X_s$ represents an electron affinity of semiconductor, $E_g$ represents a bandgap of semiconductor and $\phi_M$ represents a work function of metal. FIG. 11 shows these relationships. FIG. 9 shows what is obtained by a calculation using Yu's model in which thermionic emission and tunneling current is considered ("Electron Tunneling and Contact Resistance of Metal-Si Contact Barrier", A.Y.C.Yu, Solid State Electronics Vol.13, p.239 (1970)). As a result, the contact resistance decreases with increase of the ionized impurity concentration. This is due to the decrease of Schottky barrier width (W), as shown in FIG. 8, with increasing ionized impurity concentration increases, with the result that the tunneling current rapidly, which results in the rapid increase of tunneling current.

This is the same in the case of a metal/p-type $Zn_xMg_{1-x}S_ySe_{1-Y}$ ($0 \leq X \leq 1$, $0 \leq Y \leq 1$) interface, a metal/intermediate layer interface or an intermediate layer/p-type $Zn_xMg_{1-x}S_ySe_{1-Y}$ ($0 \leq X \leq 1$, $0 \leq Y \leq 1$) interface. For example, a figure identical with FIG. 9 shows a similar inclination in which the contact resistance differs in one figure against the same potential barrier parameter.

In other words, an ohmic contact can be made by using a intermediate layer having a high ionized impurity concentration on the layer surface of the p-type $Zn_xMg_{1-x}S_ySe_{1-Y}$ ($0 \leq X \leq 1$, $0 \leq Y \leq 1$) semiconductor on which a metal electrode is formed.

However, p-type $Zn_xMg_{1-x}S_ySe_{1-Y}$ ($0 \leq X \leq 1$, $0 \leq Y \leq 1$) semiconductor layer is formed only by MBE method, and its ionized impurity concentration is, at best, in the order of $10^{17}$ $cm^{-3}$. It is impossible to form a layer with a high ionized impurity concentration sufficient to make an ohmic contact.

SUMMARY OF THE INVENTION

The present invention provides a II-VI group compound semiconductor device comprising a p-type $Zn_xMg_{1-x}S_ySe_{1-Y}$ ($0 \leq X \leq 1$, $0 \leq Y \leq 1$) semiconductor layer, an intermediate layer comprising a compound of an element constituting the semiconductor layer and an additive element of Cd, Te or Hg formed on the semiconductor layer, and an electrode layer comprising Ni, Pt or Pd formed on the intermediate layer.

A method for manufacturing an above-mentioned device, comprising forming a $Zn_xMg_{1-x}S_ySe_{1-Y}$ ($0 \leq X \leq 1$, $0 \leq Y \leq 1$) semiconductor layer on a semiconductor substrate, forming an intermediate layer of Cd, Te or Hg on the semiconductor layer, and subsequently forming an electrode layer of Ni, Pt or Pd on the intermediate layer.

A method for manufacturing an above-mentioned device, comprising forming a $Zn_xMg_{1-x}S_ySe_{1-y}$ ($0 \leq X \leq 1$, $0 \leq Y \leq 1$) semiconductor layer on a semiconductor substrate, a lower electrode layer of Ni, Pt or Pd on the $Zn_xMg_{1-x}S_ySe_{1-y}$ ($0 \leq X \leq 1$, $0 \leq Y \leq 1$) semiconductor layer, and forming the intermediate layer of Cd, Te or Hg and an upper electrode layer of Ni, Pt or Pd in order on the intermediate layer.

A method for manufacturing an above-mentioned device comprising forming a $Zn_xMg_{1-x}S_ySe_{1-y}$ ($0 \leq X \leq 1$, $0 \leq Y \leq 1$) semiconductor layer on a semiconductor substrate, forming a compound layer of an element selected from Ni, Pt and Pd and an element selected from Cd, Te and Hg on the semiconductor layer, which may act as electrode and intermediate layers.

Accordingly, an object of the present invention is to provide a II–VI group compound semiconductor device and a method for manufacturing the same wherein small contact resistance electrodes are available without forming a p-type $Zn_xMg_{1-x}S_ySe_{1-y}$ ($0 \leq X \leq 1$, $0 \leq Y \leq 1$) semiconductor layer having a high ionized impurity concentration.

BRIEF DESCRIPTION OF THE DRAWINGS

FIG. 10 (a)–(d) is a band diagram when an intermediate layer is formed.

DETAILED DESCRIPTION OF THE PREFERRED EMBODIMENTS

Figure 6:
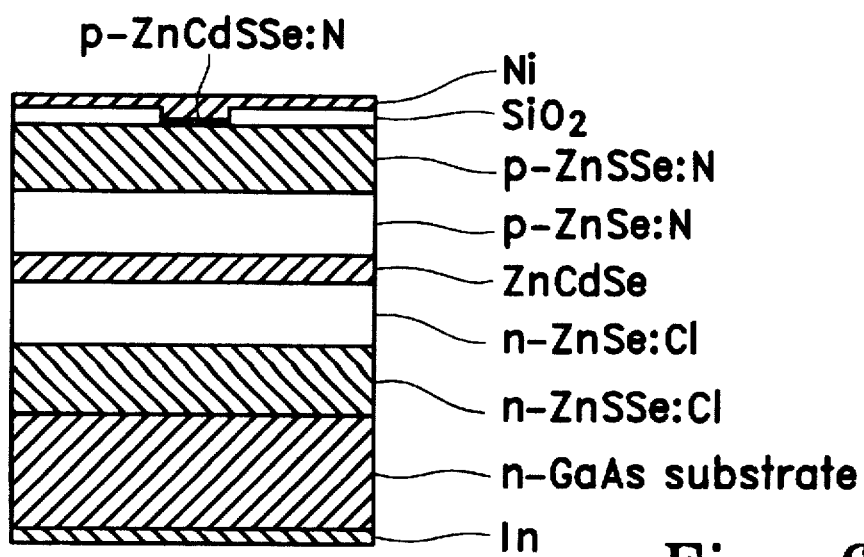
FIG. 6 is a schematic view showing an example of a II–VI group compound semiconductor device in accordance with the present invention.

The semiconductor device of the present invention has semiconductor layers stacked on a GaAs substrate such as a light-emitting diode or a semiconductor laser shown in FIG. 6, in which a GaAs substrate has $Zn_xMg_{1-x}S_ySe_{1-y}$ ($0 \leq X \leq 1$, $0 \leq Y \leq 1$) semiconductor layers, on which an intermediate layer and a metal are stacked to form an electrode.

In the following is described a device having a p-type semiconductor layer. The present invention is also applicable to one having n-type semiconductor layer.

Examples of the substrate are compound semiconductor substrate known in the art, typically GaAs substrate.

Examples of the p-type $Zn_xMg_{1-x}S_ySe_{1-y}$ ($0 \leq X \leq 1$, $0 \leq Y \leq 1$) semiconductor layers in the present invention include ZnS (X=1, Y=1), MgS (X=0, Y=1), ZnSe (X=1, Y=0), MgSe (X=0, Y=0), $ZnS_ySe_{1-y}$ (X=1, 0<Y<1), $MgS_ySe_{1-y}$ (X=0, 0<Y<1), $Zn_xMg_{1-x}S$ (0<X<1, Y=1), $Zn_xMg_{1-x}Se$ (0<X<1, Y=0) or $Zn_xMg_{1-x}S_ySe_{1-y}$ (0<X<1, 0<Y<1). Preferably, the semiconductor layers are ZnSe (most extensively used for contact layers) $ZnS_{0.07}Se_{0.93}$ (lattice-matched to GaAs) and ZnMgSSe (lattice-matched to GaAs and having not more than 3.0 eV of band gap energy and not less than $10^{17}$ cm$^{-3}$ of effective acceptor concentration Na—Nd). The thickness of the semiconductor layers is not limited and can be suitably adjusted in accordance with use of the semiconductor device or the like.

The semiconductor layer may comprise one kind of semiconductor layer or plural kinds of semiconductor layers. For example, in the case of laser device, the present invention includes a structure which has, on a substrate as the semiconductor layers, a buffer layer, cladding layer, optical waveguide layer, active layer, optical waveguide layer, cladding layer and contact layer in this order. Not limited by this example, the present invention includes a device having $Zn_xMg_{1-x}S_ySe_{1-y}$ ($0 \leq X \leq 1$, $0 \leq Y \leq 1$) as the semiconductor layer.

The intermediate layer of the present invention comprises, for example, a compound of the elements constituting the semiconductor layer and Cd, a compound of the elements constituting the semiconductor layer and Te, a compound of the elements constituting the semiconductor layer and Hg, a compound formed of two or three of the above three compounds, or a compound not less than ternary elements. Specifically, these are ZnSCd, MgSeCd, ZnSSeCd, MgSSeCd, ZnMgSCd, ZnMgSeCd, ZnMgSSeCd, ZnSTe, MgSeTe, ZnSSeTe, MgSSeTe, ZnMgSTe, ZnMgSeTe, ZnMgSSeTe, ZnSHg, MgSeHg, ZnSSeHg, MgSSeHg, ZnMgSHg, ZnMgSeHg or ZnMgSSeHg.

The concentration of the additive element (Cd, Te or Hg) in the intermediate layer may be uniformly distributed. Preferably, the concentration is higher on the electrode layer side than the semiconductor layer side. More preferably, the concentration continuously decreases from the electrode side to the semiconductor layer side, on which it becomes 0%.

Figure 9:
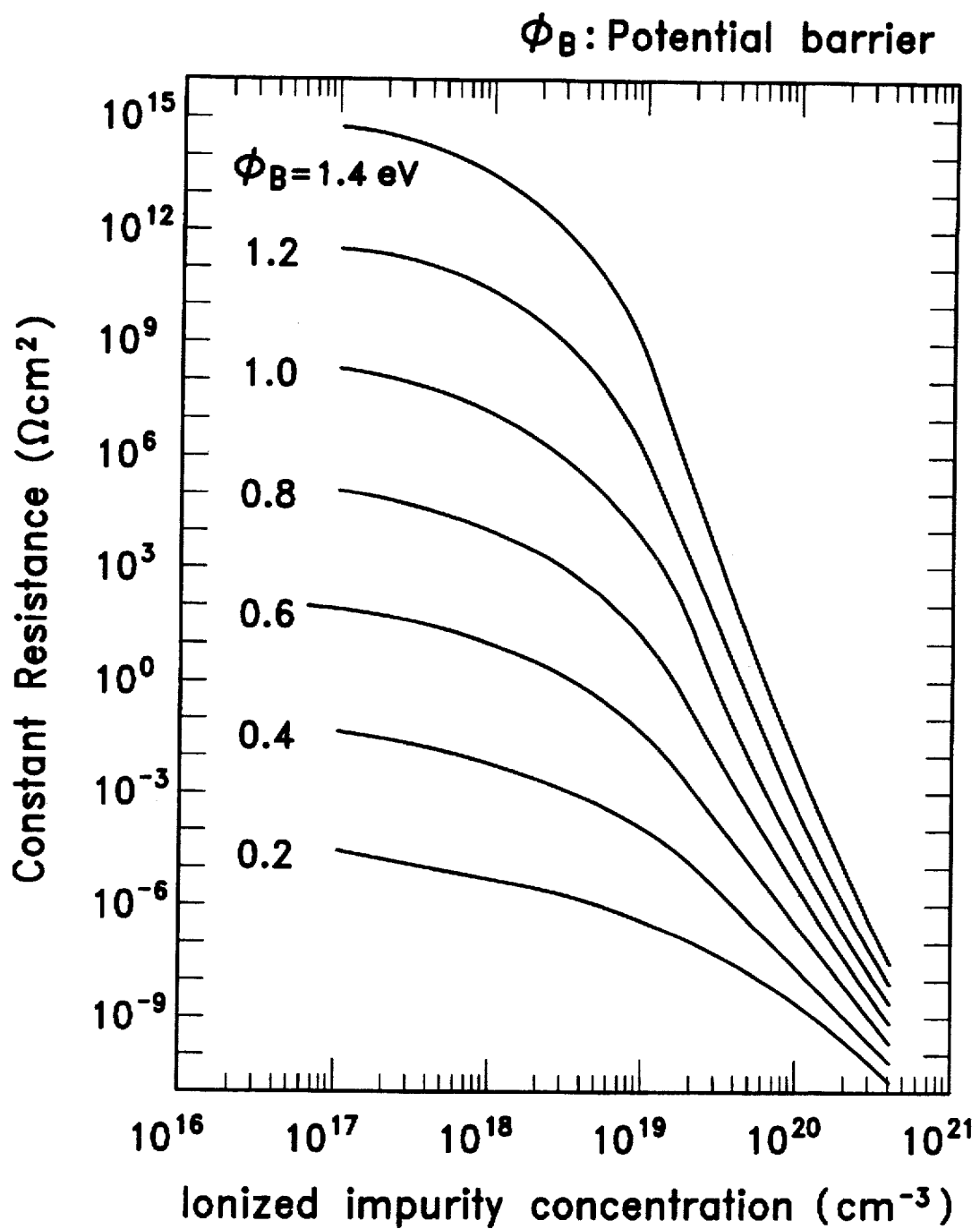
FIG. 9 shows a graph illustrating ionized impurity concentration dependence of contact resistance in a Schottky junction of a p-type ZnSe and a metal theoretically calculated based on a model considering thermionic emission and tunneling current.
Figure 11:
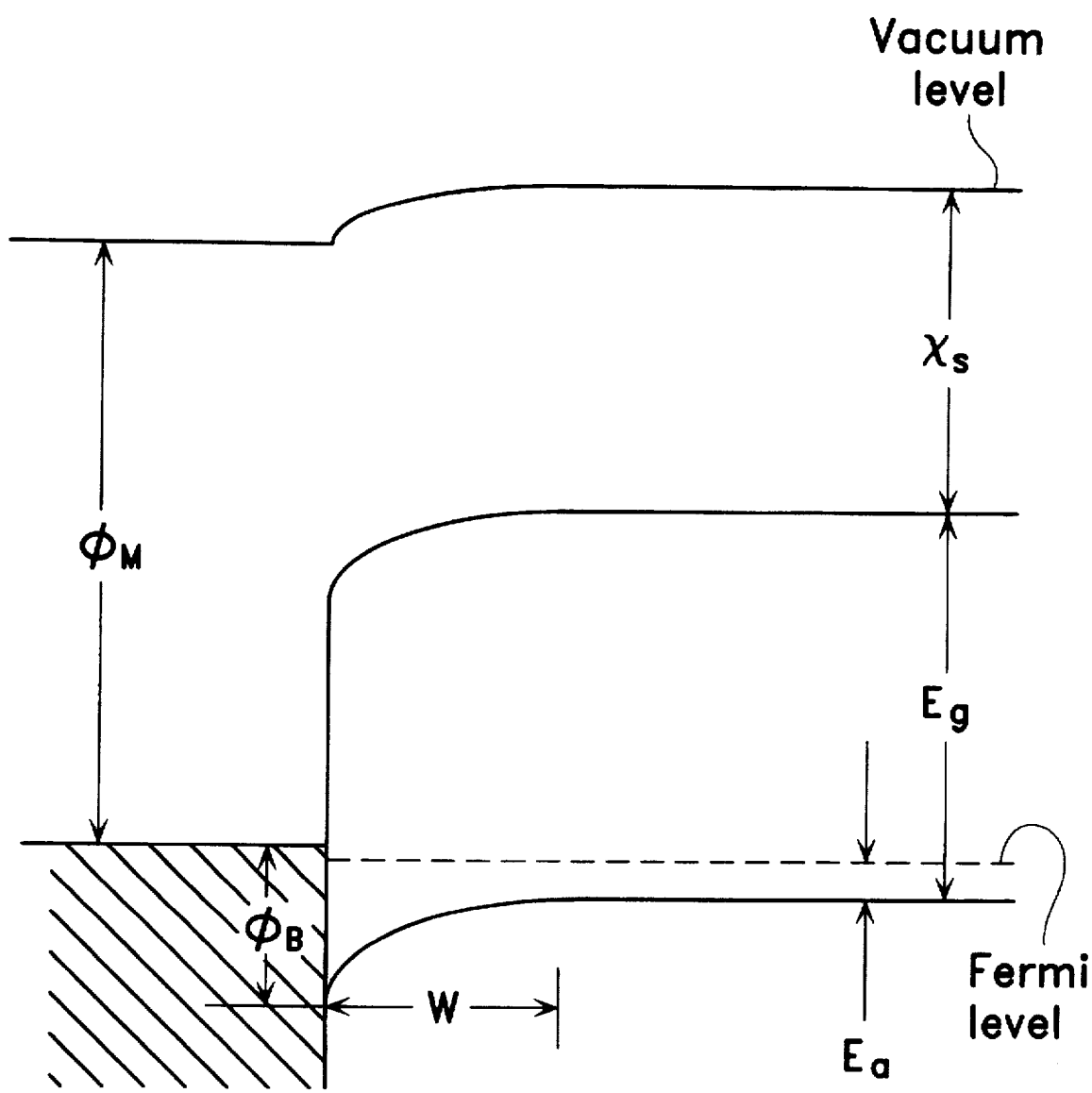
FIG. 11 is a band diagram showing the relationship of FIG. 8: $\phi_B = x_S + E_g - \phi_M$

In order to decrease contact resistance, it is preferable that a p-type impurity (such as N, Li and the like) is added to the intermediate layer and that the concentration is as high as or higher than that of the p-type impurity in the semiconductor layer. The concentration, though depending on the kind of p-type impurities, is not less than $1 \times 10^{18}$ cm$^{-3}$. As shown in FIG. 9, the higher the p-type impurity concentration in the intermediate layer becomes, the more suitably lower the contact resistance becomes. The energy barrier between the intermediate layer and semiconductor layer may be not more than 0.6 eV, preferably, not more than 0.4 eV at which the contact resistance decreases remarkably as shown in FIG. 9. In the case of Au/p-ZnSe, for example, it corresponds to the curve φB=1.2 eV in FIG. 9. The contact resistance of the semiconductor device in accordance with the present invention can be decreased to approximately $10^{-14}$ times compared with that of Au/p-ZnSe.

The electrode layer usable for the present invention may contain intermetallic compounds of the elements constituting the intermediate or semiconductor layer and Ni, Pt or Pd. Examples of the electrode layers include NiZn, NiSe, NiCd, NiHg, NiTe, PdZn, PdSe, PdCd, PdHg, PdTe, PtZn, PtSe, PtCd, PtHg, or PtTe or a combination thereof which is a poly-element-type intermetallic compound. The intermetallic compounds which are chemically stable with a melting point over 600° C. can form electrode layers highly resistant to heat and corrosion.

The work functions of Ni, Pt and Pd used for the electrode layer are 5.15 eV, 5.65 eV and 5.13 eV, respectively. They are larger than the work function of Au (5.1 eV) used for the electrode metal, which makes it possible to reduce the potential barrier against the intermediate layer (p-type semiconductor).

The energy barrier between the intermediate layer and electrode layer may be lower than that between the electrode layer and semiconductor layer, preferably not more than 0.4 eV. The energy barrier reduced to approximately 0.6 eV lowers contact resistance to approximately $10^{-10}$ times in comparison with Au/p-ZnSe. Further, the energy barrier reduced to not more than 0.4 eV lowers contact resistance to not more than $10^{-14}$ times.

The present invention provides a method for manufacturing a II-VI group compound semiconductor device comprising forming a p-type $Zn_xMg_{1-x}S_YSe_{1-Y}$ ($0 \leq X \leq 1$, $0 \leq Y \leq 1$) semiconductor layer on a semiconductor substrate and forming an intermediate layer of Cd, Te or Hg thereon, followed by the formation of an electrode layer of Ni, Pt or Pd on the intermediate layer.

Alternatively, the present invention provides a method for manufacturing a II-VI group compound semiconductor device wherein a lower electrode layer of Ni, Pt or Pd, the intermediate layer of Cd, Te or Hg and an upper electrode layer of Ni, Pt or Pd are subsequently formed on the above mentioned semiconductor layer.

Furthermore, the present invention provides a method for manufacturing a II-VI group compound semiconductor device wherein a compound layer of Ni, Pt or Pd and Cd, Te or Hg is formed on the p-type $Zn_xMg_{1-x}S_YSe_{1-Y}$ ($0 \leq X \leq 1$, $0 \leq Y \leq 1$) semiconductor layer.

The semiconductor layer of the present invention is formed by being stacked once to several times by a known method using the desired constituting elements. The known method is, for example, MBE. Since naturally oxidized and carbonized films are formed on the surface of the semiconductor layer with the passage of time, it is preferable to remove the oxidized and carbonized films before forming the intermediate layer.

It is possible to stack the electrode layer and the lower and upper electrode layers by a known method using the desired constituting elements. The method is the electron beam evaporation method or sputter method.

When the intermediate layer and electrode layer are stacked by the above method, at the interfaces between the semiconductor layer and intermediate layer, and between the electrode layer and intermediate layer are generally formed compound layers of the elements constituting the two layers. Heat treatment after stacking favorably broadens the area where the compound layer of the elements is formed. The heat treatment temperature, though depending on the elements used, is preferably in the range of 100° C. -300° C. The electric furnace annealing or RTA (Rapid Thermal Annealing) method is available for use.

In any case, it is preferable to remove the oxides and carbides from the semiconductor layer surface before forming electrode or lower electrode layers.

In accordance with the present invention, by forming an intermediate layer in the first place, the potential barrier between a p-type $Zn_xMg_{1-x}S_YSe_{1-Y}$ ($0 \leq X \leq 1$, $0 \leq Y \leq 1$) semiconductor layer and an electrode layer is divided into two parts between the p-type $Zn_xMg_{1-x}S_YSe_{1-Y}$ ($0 \leq X \leq 1$, $0 \leq Y \leq 1$) semiconductor layer and the intermediate layer, and between the intermediate layer and the electrode layer (FIG. 10(b)). Since the contact resistance on the interface superlinearly decreases in response to the decrease of the potential barrier as illustrated in FIG. 9 and the potential barrier is divided into two, the whole contact resistance decreases remarkably and an ohmic contact is easier to make. FIG. 10(a) shows a band diagram in which the intermediate layer is not formed.

As shown in FIG. 10(d), which conceptually illustrates the state of each layer before junction, contact resistance is decreased because the top of a valence band of the intermediate layer in accordance with the present invention is positioned higher than that of the p-type $Zn_xMg_{1-x}S_YSe_{1-Y}$ ($0 \leq X \leq 1$, $0 \leq Y \leq 1$) semiconductor layer, and positioned between the top of the valence band of the p-type $Zn_xMg_{1-x}S_YSe_{1-Y}$ ($0 \leq X \leq 1$, $0 \leq Y \leq 1$) semiconductor layer and the Fermi level of the electrode layer.

More particularly, the semiconductor layer, intermediate layer and electrode layer in accordance with the present invention satisfy the relationship:

$$\phi_M < X_s + E_{gi} < X_s + E_{gs} - E_{as},$$

in which $\phi_M$ represents a work function of the electrode layer, Xi represents an electron affinity of the intermediate layer, Egi represents a bandgap of the intermediate layer, Eai represents an impurity level of the intermediate layer, Xs represents an electron affinity of the semiconductor layer, Egs represents a bandgap of the semiconductor layer and Eas represents an impurity level of the semiconductor layer.

Figure 7:
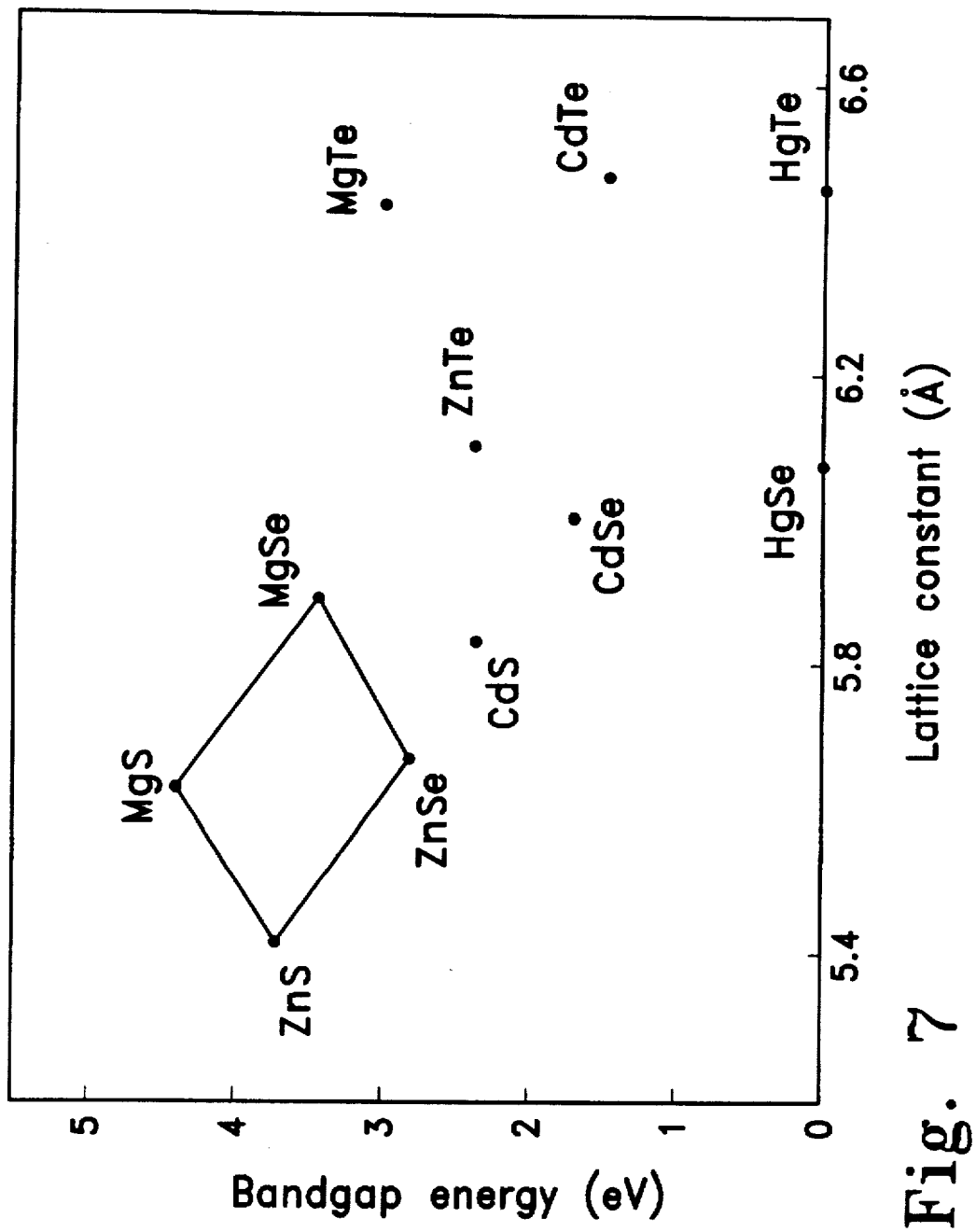
FIG. 7 shows the relationship between the lattice constant and bandgaps of various II–VI group compound semiconductors.
Figure 8:
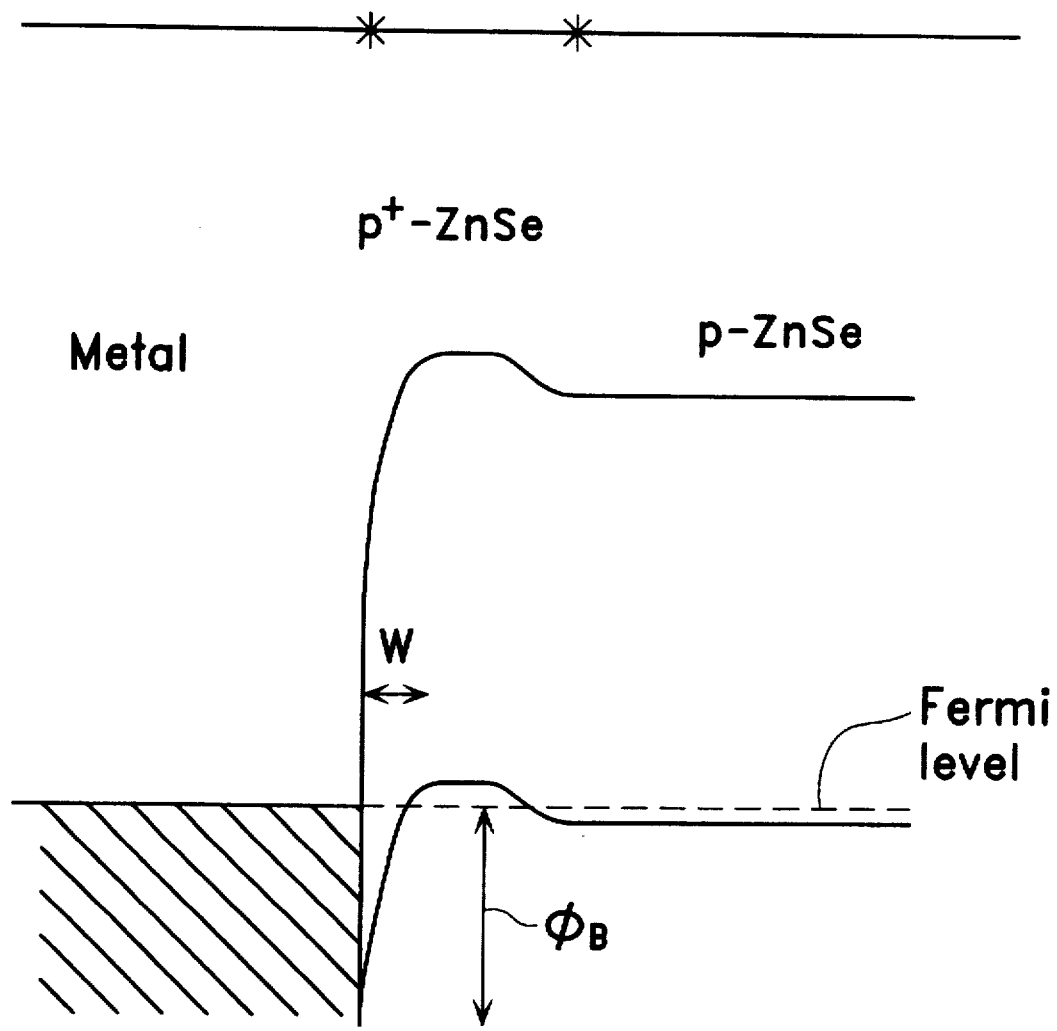
FIG. 8 is a band diagram illustrating the width of the Schottky barrier on the contact interface of metal and p-type ZnSe.

Furthermore, in reference to the above, as shown in FIG. 7 illustrating the relationship between lattice constant and band gap energy for each compound, the intermediate layer comprising a compound of the elements constituting the p-type $Zn_xMg_{1-x}S_YSe_{1-Y}$ ($0 \leq X \leq 1$, $0 \leq Y \leq 1$) semiconductor layer and Cd, Te or Hg is a p-type $Zn_aMg_bCd_{1-a-b}S_cSe_{1-c}$ ($0 \leq a$, b, $c \leq 1$, $a+b \leq 1$) semiconductor layer, a p-type $Zn_dMg_{1-d}S_eTe_fSe_{1-e-f}$ ($0 \leq d$, e, $f \leq 1$, $e+g \leq 1$) semiconductor layer or a p-type $Zn_gMg_hHg_{1-g-h}S_iSe_{1-i}$ ($0 \leq g$, h, $i \leq 1$, $g+h \leq 1$) semiconductor layer, each of which has a smaller bandgap than the p-type $Zn_xMg_{1-x}S_YSe_{1-Y}$ ($0 \leq X \leq 1$, $0 \leq Y \leq 1$) semiconductor layer.

Since a semiconductor with a small bandgap has a lower impurity level Ea than one with a large bandgap, the impurity level of the intermediate layer is lower than that of the p-type $Zn_xMg_{1-x}S_YSe_{1-Y}$ ($0 \leq X \leq 1$, $0 \leq Y \leq 1$) semiconductor layer. In other words, impurities are easier to activate in the intermediate layer than in the semiconductor layer, the ionized impurity concentration in the intermediate layer is easy to increase and the contact resistance between the intermediate layer and electrode layer becomes very low as shown in FIG. 9.

Furthermore, the bandgap of the intermediate layer being smaller than that of the semiconductor layer makes the potential barrier smaller and decreases the contact resistance between the electrode layer and intermediate layer.

When Cd is used for an additive element, according to the anion common rule, the valence band discontinuity between the intermediate layer and p-type $Zn_xMg_{1-x}S_YSe_{1-Y}$ ($0 \leq X \leq 1$, $0 \leq Y \leq 1$) semiconductor layer, that is, the potential barrier, becomes approximately zero. Thus, as shown in FIG. 9, the contact resistance between the intermediate layer and semiconductor layer is not more than $10^{-6} \Omega cm^2$, which decreases the contact resistance and helps to make an ohmic contact.

When Te is used for an additive element, the top of valence band of the intermediate layer rises more than that of the p-type $Zn_xMg_{1-x}S_YSe_{1-Y}$ ($0 \leq X \leq 1$, $0 \leq Y \leq 1$) semiconductor layer, the potential barrier between the electrode layer and the intermediate layer becomes smaller and the contact resistance between the electrode layer and the intermediate layer lowers advantageously.

When Hg is used for an additive element, the reduction of bandgap is larger than that of the same added amount of Cd and Te, the intermediate layer becomes semi-metallic, an ohmic contact to metal is easier to make and just as with Cd, according to the anion common rule, the contact resistance between the intermediate layer and semiconductor layer is not more than $10^{-6} \Omega cm^2$. This helps to make an ohmic contact.

The above-mentioned effects of the additive elements can be achieved in the same way at a combination of the additive elements.

When Ni and Pd is used for the electrode layer, it is possible to manufacture electrode structures with better mechanical strength, such as adhesion, than prior art. This is because Ni and Pd, which constitute the high melting-point intermetalic compounds, have greater binding energy when combined with Zn and Se than with oxygen, destroy native oxide films by reaction during formation or by heat treatment after formation, and have high adhesion by combining with Zn or Se.

Since ionized impurity concentration can be made higher in the intermediate layer than in the semiconductor layer, it is more advantageous to have a potential barrier between the electrode layer and intermediate layer; accordingly, it is preferable that additive element concentration is higher on the electrode layer side. For the same reason, the energy barrier between the intermediate layer and electrode layer may be smaller than that between the electrode layer and semiconductor layer, and it is possible to decrease contact resistance efficiently.

Furthermore, when the additive element concentration in the intermediate layer is graded so that it is high on the electrode layer side, not only is the potential barrier corresponding to the difference in concentration between both intermediate layer interfaces absorbed into the intermediate layer, but it is possible to keep small the potential barrier on the interface between the intermediate layer and semiconductor layer because of a lack of rapid compositional change from the intermediate layer to the semiconductor layer. In addition, by continuously lowering the additive element concentration in the intermediate layer from the electrode layer side to the semiconductor layer side on which it becomes zero, the potential barrier between the intermediate layer and p-type $Zn_xMg_{1-x}S_YSe_{1-Y}$ ($0 \leq X \leq 1$, $0 \leq Y \leq 1$) semiconductor layer becomes zero, and an ohmic contact is easier to make than when the additive element concentration is uniform in the intermediate layer (FIG. 10(c)).

On the other hand, when the concentration grades lower on the electrode layer side, both the potential barriers divided into two enlarge more than when the concentration is uniform and this is undesirable for obtaining low contact resistance.

When a high concentration of an additive element is added, a lattice strain based on the difference in the semiconductor layer in properties (lattice constant, thermal expansion efficiency), crystal defect and deteriorated electrode characteristics result. However, it is possible to lessen these effects by the higher additive element concentration on the electrode layer side of the intermediate layer than on the semiconductor layer side.

When the electrode layer contains intermetallic compounds of Ni, Pt or Pd and the elements constituting the intermediate layer, the elements contained commonly in the electrode layer and intermediate layer form bondings such as Ni—Cd—Se and Ni—Zn—Se on the interface between the electrode layer and intermediate layer. This is desirable for making an ohmic contact because an insulation layer which intercepts electric current such as an oxide layer is not formed between the electrode layer and intermediate layer.

Elements contained commonly in the electrode layer and intermediate layer form bondings such as Ni—Cd—Se and Ni—Zn—Se on the interface between the electrode layer and intermediate layer, and provide an excellent mechanical strength such as adhesion.

In accordance with the method for manufacturing the semiconductor device of the present invention, it can form an intermediate layer comprising compounds of a p-type $Zn_xMg_{1-x}S_YSe_{1-Y}$ ($0 \leq X \leq 1$, $0 \leq Y \leq 1$), and Cd, Te or Hg between the electrode layer and semiconductor layer, and provides electrode structures excellent in mechanical strength such as adhesion because it contains common elements in the electrode layer and intermediate layer, and in the intermediate layer and semiconductor layer.

When an intermediate layer comprising Cd, Te or Hg is inserted between the upper and lower electrode layers comprising Ni, Pt or Pd, by the reaction of the electrode layer and intermediate layer during the forming process or by annealing treatment, Cd, Te or Hg diffuses into the p-type $Zn_xMg_{1-x}S_YSe_{1-Y}$ ($0 \leq X \leq 1$, $0 \leq Y \leq 1$) semiconductor layer and a compound of the p-type $Zn_xMg_{1-x}S_YSe_{1-Y}$ ($0 \leq X \leq 1$, $0 \leq Y \leq 1$) semiconductor and Cd, Te or Hg is formed.

When a compound of Ni, Pt or Pd and Cd, Te or Hg is formed on the p-type $Zn_xMg_{1-x}S_YSe_{1-Y}$ ($0 \leq X \leq 1$, $0 \leq Y \leq 1$) semiconductor layer, by the reaction during the deposition or the annealing treatment, Cd, Te or Hg contained in the compound diffuses into the p-type $Zn_xMg_{1-x}S_YSe_{1-Y}$ ($0 \leq X \leq 1$, $0 \leq Y \leq 1$) semiconductor layer and combines with the p-type $Zn_xMg_{1-x}S_YSe_{1-Y}$ ($0 \leq X \leq 1$, $0 \leq Y \leq 1$) semiconductor.

Furthermore, the depositing of Ni, Pt or Pd, or compounds containing Ni, Pt or Pd on the p-type $Zn_xMg_{1-x}S_YSe_{1-Y}$ ($0 \leq X \leq 1$, $0 \leq Y \leq 1$) semiconductor layer provides a high adhesion between the metals and semiconductor.

These metals, having high melting points, are excellent in thermal stability. Moreover, they are chemically stable compounds and enable the formation of electrodes that are very resistant to heat and corrosion.

Ni or Pd in the three metals have larger energy binding with Zn and Se than with oxygen. When they are deposited on a p-type $Zn_xMg_{1-x}S_YSe_{1-Y}$ ($0 \leq X \leq 1$, $0 \leq Y \leq 1$) semiconductor layer, they destroy native oxide films by a reaction during the deposition or heat treatment after the deposition, and have a high adhesion in bonding with Zn or Se. Besides, they easily destroy native oxide films and diffuse themselves into semiconductor layers (the Kirkendall effect), and are convenient for obtaining pure interfaces. The destruction of native oxide films makes it easy to diffuse Cd, Te or Hg into the semiconductor layer, and is convenient for forming compounds with a p-type $Zn_xMg_{1-x}S_ySe_{1-Y}$ ($0 \leq X \leq 1$, $0 \leq Y \leq 1$) semiconductor layer. On the other hand, since Pt has the largest work function, it shows the smallest potential barrier against p-type $Zn_xMg_{1-x}S_ySe_{1-Y}$ ($0 \leq X \leq 1$, $0 \leq Y \leq 1$) semiconductor layers and is convenient for obtaining low contact resistance.

When the surface of a p-type $Zn_xMg_{1-x}S_ySe_{1-Y}$ ($0 \leq X \leq 1$, $0 \leq Y \leq 1$) semiconductor layer is cleaned in the process, good ohmic characteristics are reproducible. A chemical etching with an etching solution containing a saturated bromine water(SBW), for example, removes native oxides and carbides formed on the surface of a p-type $Zn_xMg_{1-x}S_ySe_{1-Y}$ ($0 \leq X \leq 1$, $0 \leq Y \leq 1$), forms a clean surface, and enables the steady manufacture of the electrode structures having the characteristics of the present invention. When the electrode structure manufacturing process follows immediately after p-type semiconductor layer growth(in situ process), the cleaning step is omittable.

EXAMPLES

Example 1

Nitrogen-doped p-type ZnSe (Na—Nd=$1 \times 10^{18}$ cm$^{-3}$) was grown by MBE method using nitrogen radical doping technique on a semi-insulating GaAs substrate. The surface of the p-type ZnSe layer was cleaned by ultrasonic for 5 minutes in acetone and 2 minutes in ethanol, and was etched for 3 minutes by saturated bromine water (SBW): hydrobromic acid (HBr): water ($H_2O$)=1:10:90 for an etchant at room temperature. The oxides and carbides on the surface of the p-type ZnSe layer were removed by the etching.

Next, with the p-type ZnSe-formed semi-insulating GaAs substrate kept at room temperature, 5 nm of an Ni layer (lower electrode layer) were deposited on the p-type ZnSe layer by electron beam evaporation, 5 nm of a Cd layer (intermediate layer) were deposited by resistive heating evaporation at the same substrate temperature, 50 nm of an Ni layer (upper electrode layer) were deposited by electron beam evaporation at the same substrate temperature. The electron beam evaporation and resistive heating evaporation were carried out at background pressure in the range of $3-5 \times 10^{-7}$ Torr and at not more than $5 \times 10^{-6}$ Torr of vacuum during the evaporation, followed by heat treatments for several samples.

Figure 4:
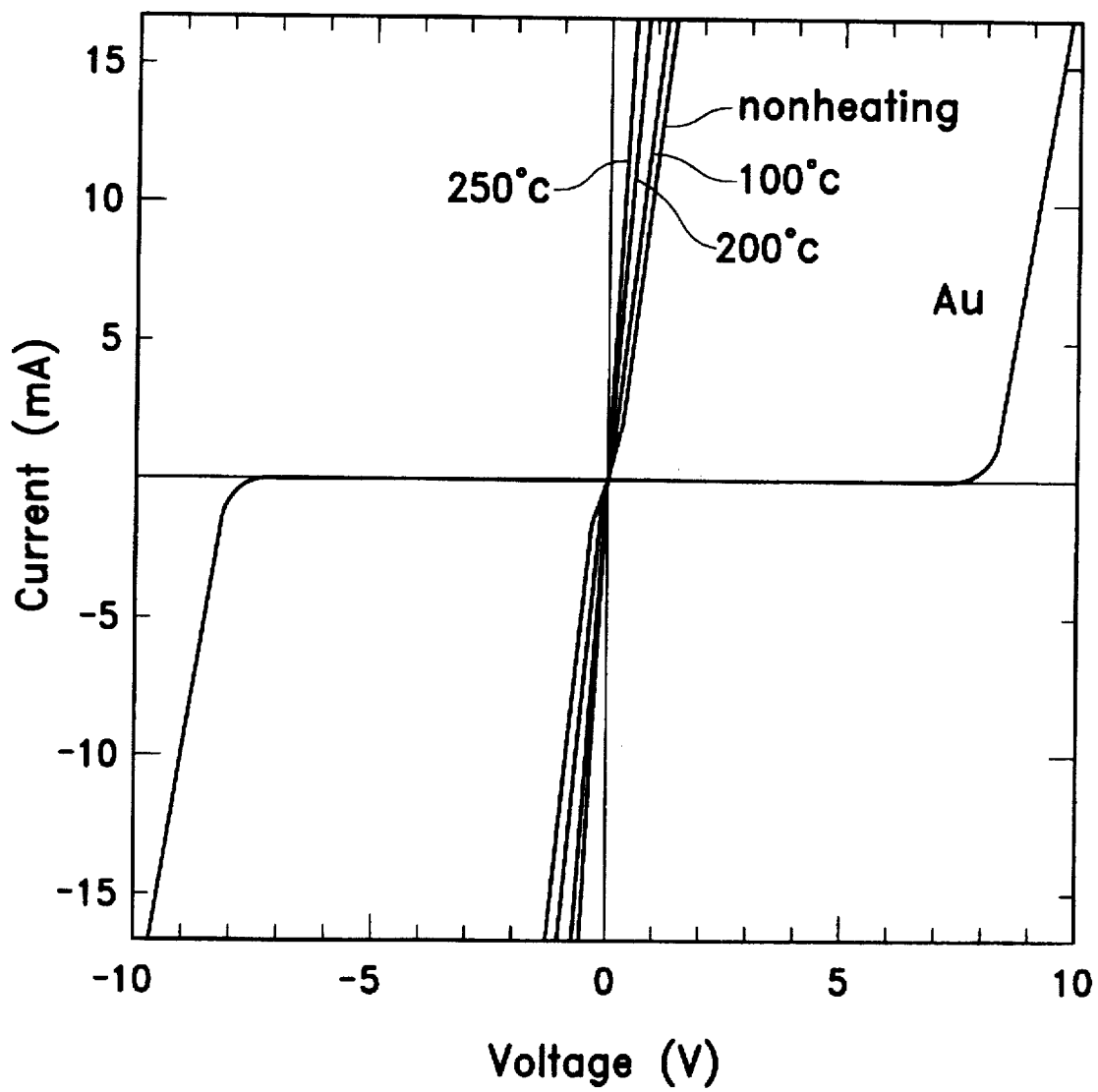
FIG. 4 is a graph illustrating the dependence of the current-voltage characteristics between a p-type electrode on annealing temperatures.

Two electrodes with 1 mm diameter of circular planes were formed, and the distance between the centers of the two circles was 2 mm. The current-voltage characteristics between the two electrodes were measured. The annealing temperature dependence of the current-voltage characteristics is shown in FIG. 4. In comparison, current-voltage characteristic with Au electrode is also shown. Annealing time was 7 minutes for each temperature. The samples with no heat treatment and those treated at 100° C., which have a bit of Schottky contact, showed much more improvement in the characteristics than Au electrodes, and the samples treated at 200° C. and 250° C. showed good ohmic contacts.

Though in the example Ni was used for the electrode layer and Cd was used for the intermediate layer constituting element, the materials are not limited to them. The elements which form a low-energy-barrier intermediate layer to ZnSe can be used for the elements which destroy native oxide film on the surface of ZnSe as a basic element, which have a good adhesion, and which have a large work function and constitute intermediate layers. Besides the materials used in the example, Pt or Pd for the metal and Te or Hg for the element constituting the intermediate layer are preferable. The sputter method as well as the evaporation method can be used to deposit electrode metals or intermetallic compounds.

In addition to the electric furnace annealing in the example, RTA (Rapid Thermal Annealing) can be used for the heat treatment process. The heat treatment temperature, depending on the elements constituting the intermediate layer, should be 100° C.–300° C. A temperature lower than 100° C. is not sufficient for semiconductor intermediate layer formation, and a temperature higher than 300° C. makes the device properties deteriorate when used for devices.

Figure 1:
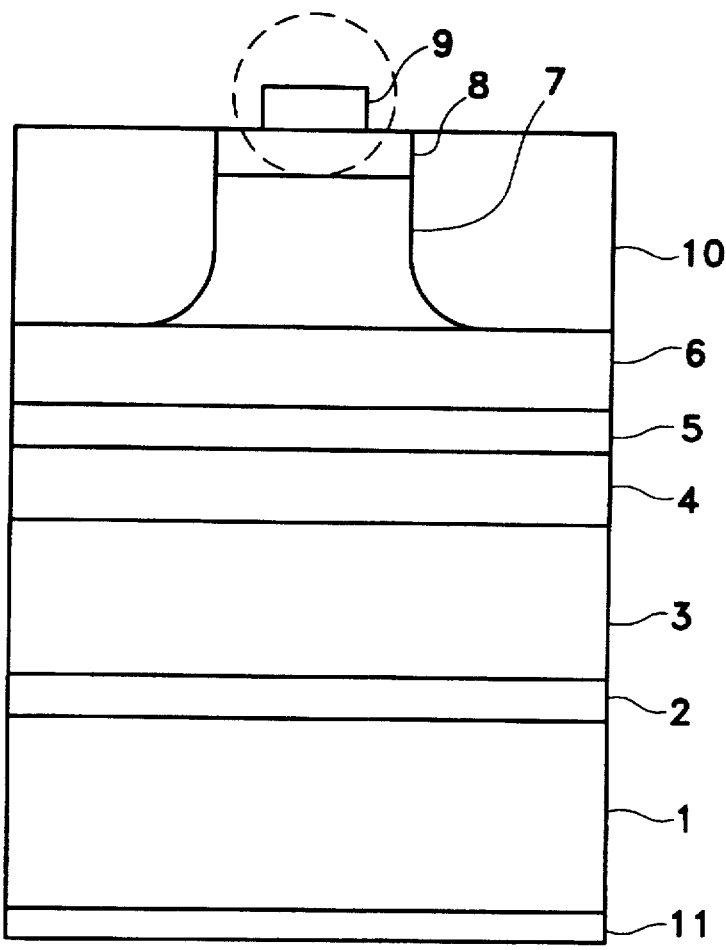
FIG. 1 is a schematic sectional view showing an embodiment of a II–VI group compound semiconductor device in accordance with the present invention.

FIG. 1 shows an II–VI group compound semiconductor (laser) device using an ohmic contact structure of the present invention. The laser device structure comprises, on an n-type GaAs substrate 1, an n-type $ZnS_{0.07}Se_{0.93}$ buffer layer 2 (0.1 μm of film thickness, Nd—Na=$1 \times 10^{18}$ cm$^{-3}$), an n-type $Zn_{0.91}Mg_{0.09}S_{0.12}Se_{0.88}$ cladding layer 3 (1.0 μm of film thickness, Nd—Na=$5 \times 10^{17}$ cm$^{-3}$), an n-type $ZnS_{0.07}Se_{0.93}$ optical waveguide layer 4 (0.1 μm of film thickness, Nd—Na=$5 \times 10^{17}$ cm$^{-3}$), a $Zn_{0.8}Cd_{0.2}Se$ active layer 5 (75Å of film thickness), a p-type $ZnS_{0.07}Se_{0.93}$ optical waveguide layer 6 0.1 μm of film thickness, Na—Nd=$5 \times 10^{17}$ cm$^{-3}$), a p-type $Zn_{0.91}Mg_{0.09}S_{0.12}Se_{0.88}$ cladding layer 7 (1.5 μm of film thickness, Na—Nd=$5 \times 10^{17}$ cm$^{-3}$), a p-type ZnSe contact layer 8 (0.1 μm of film thickness, Na—Nd=$2 \times 10^{18}$ cm$^{-3}$), a p-type side electrode 9, an n-type side electrode 11 and a polyimide buried layer 10. The layers from the buffer layer 2 to the contact layer 8 were formed by MBE method.

Figure 2:
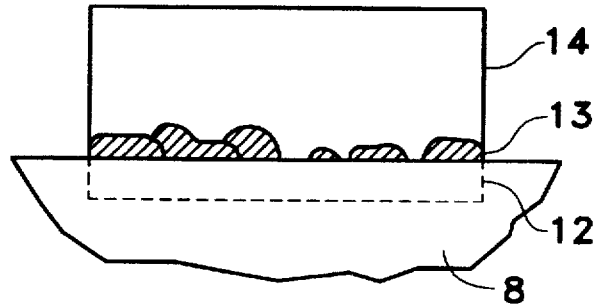
FIG. 2 is a schematic enlarged view of a p-type electrode in the semiconductor device of FIG. 1.

An enlarged view of the p-type electrode 9 is shown in FIG. 2. In the p-type ZnSe contact layer 8 is formed a ZnCdSe layer 12, on which is formed a metal layer 14 of Ni, and on the interface between the electrode layer 14 and ZnCdSe layer 12 is formed a region 13 comprising thermally stable intermetallic compounds of NiCd, NiSe and NiZn.

Figure 3:
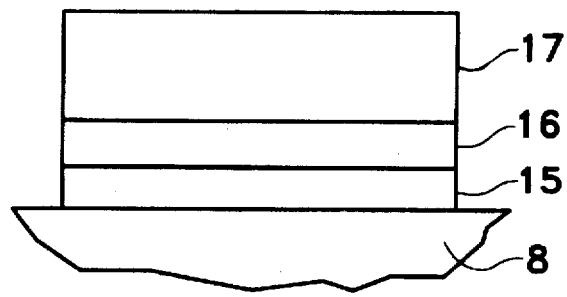
FIG. 3 is a schematic sectional view for manufacturing an electrode of FIG. 2.

The electrode 9 was formed by depositing, on the p-type ZnSe contact layer 8, Ni layers 15 and 17 by electron beam evaporation at room temperature and a Cd layer 16 by resistive heating evaporation, followed by 7 minutes of heat treatment at 250° C. with an electric furnace (See FIG. 3). The electron beam evaporation and resistive heat evaporation were carried out at back ground pressure in the range of $3-5 \times 10^{-7}$ Torr and at not more than $5 \times 10^{-6}$ Torr of vacuum during the evaporation. The film thicknesses of 15, 16 and 17 were 5 nm, 5 nm and 50 nm respectively.

Before depositing the electrode metals, the surface of the p-type ZnSe contact layer was cleaned by ultrasonic for 5 minutes in acetone and 2 minutes in ethanol, and etched for 3 minutes by SBW:HBr:$H_2O$=1:10:90 as an etchant at room temperature. The oxides and carbides on the surface of the p-type ZnSe contact layer were removed by the etching.

A laser device with 1 mm of cavity length was made of the laser structure in FIG. 1 (stripe width: 5 μm) by cleavage. The laser device was set on a copper heat sink with junction-up configuration, and the current-optical output characteristics and current-voltage characteristics of the device by CW operation were measured at room temperature. The end of the laser device cavity had no coating and kept cleaved.

Figure 5:
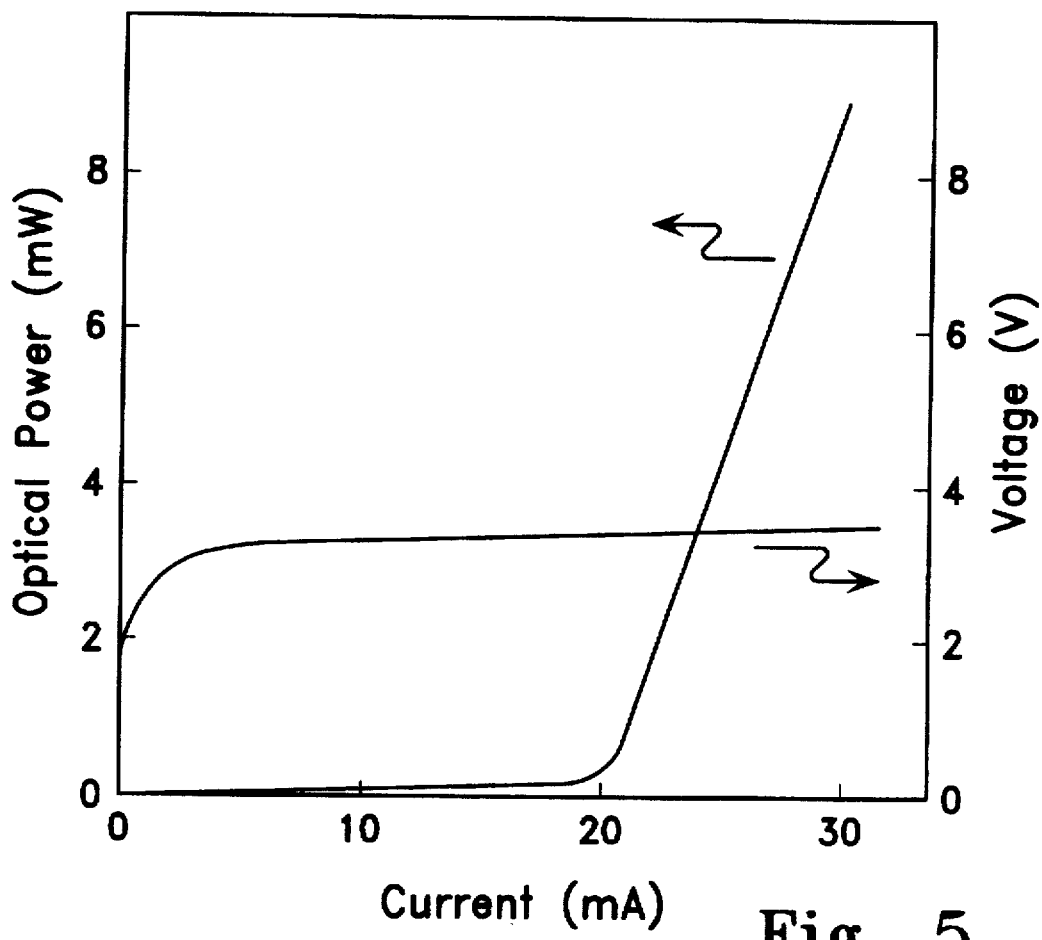
FIG. 5 is a graph illustrating current-optical output power characteristics and current-voltage characteristics of a laser device as an embodiment of the present invention.

FIG. 5 shows the current-optical output characteristics and current-voltage characteristics of the laser device. As shown in FIG. 5, 20 mA of threshold current and 3.5 V of threshold level voltage were obtained.

On the other hand, when the p-type side electrode 9 was formed of an Au electrode, the voltage was not less than 10

V, and when the p-type side electrode 9 was formed of an Au/ZnTe/ZnSe-ZnTe electrode structure by Fan et al. ("Continuous-wave, room temperature, ridge waveguide green-blue diode laser", A. Salokatve et al., Electronics Lett. Vol.29 p.2192), it was 4.4 V.

Example 2

A nitrogen-doped p-type $ZnS_{0.2}Se_{0.8}$ (Na—Nd=$2 \times 10^{17}$ cm$^{-3}$) was grown by MBE method using nitrogen radical doping technique on a semi-insulating high resistance GaAs substrate, and the surface of the p-type ZnSSe was cleaned in the same way as in Example 1.

Next, the semi-insulating high resistance GaAs substrate on which the p-type $ZnS_{0.2}Se_{0.8}$ was formed was kept at room temperature, 5 nm of a Hg layer was deposited on the p-type $ZnS_{0.2}Se_{0.8}$ by resistive heat evaporation, and 50 nm of a Ni layer was deposited by electron beam evaporation to form an electrode.

Example 3

A nitrogen-doped p-type $Zn_{0.91}Mg_{0.09}S_{0.12}Se_{0.78}$ (Na—Nd=$5 \times 10^{17}$ cm$^{-3}$) was grown by MBE method using nitrogen radical doping method on a semi-insulated high resistance GaAs substrate, and the surface of the p-type ZnMgSSe was cleaned in the same way as in Example 1.

Next, the semi-insulating high resistance GaAs substrate on which the p-type ZnMgSSe was formed was kept at room temperature, three types of samples, namely a 2 nm deposition of a Cd layer, a 2 nm deposit of a Te layer and a 2 nm deposit of an Hg layer, were made on the p-type ZnMgSSe by resistive heat evaporation, and 50 nm of a Pd layer was deposited on each sample by electron beam evaporation to form an electrode.

Example 4

A nitrogen-doped p-type $Zn_{0.91}Mg_{0.09}Se$ (Na—Nd=$5 \times 10^{17}$ cm$^{-3}$) was grown by MBE method using nitrogen radical doping technique on a semi-insulated GaAs substrate, and the surface of the p-type ZnMgSe was cleaned in the same way as in Example 1.

Next, the semi-insulated GaAs substrate on which the p-type ZnMgSe was formed was kept at room temperature, 5 nm of a Te layer was deposited on the p-type ZnMgSe layer by resistive heat evaporation, and three types of samples, namely a 50 nm deposit of a Ni layer, a 50 nm deposit of a Pt layer and a 50 nm deposit of a Pd layer, were made on the Te layer by electron beam evaporation to form an electrode.

Example 5

AES characterization of ZnSe surfaces

In order to understand the effect of SBW etching, ZnSe surfaces of a polycrystalline substrate and an epitaxial film grown by MBE are analyzed by Auger electron spectroscopy (AES).

Figure 12:
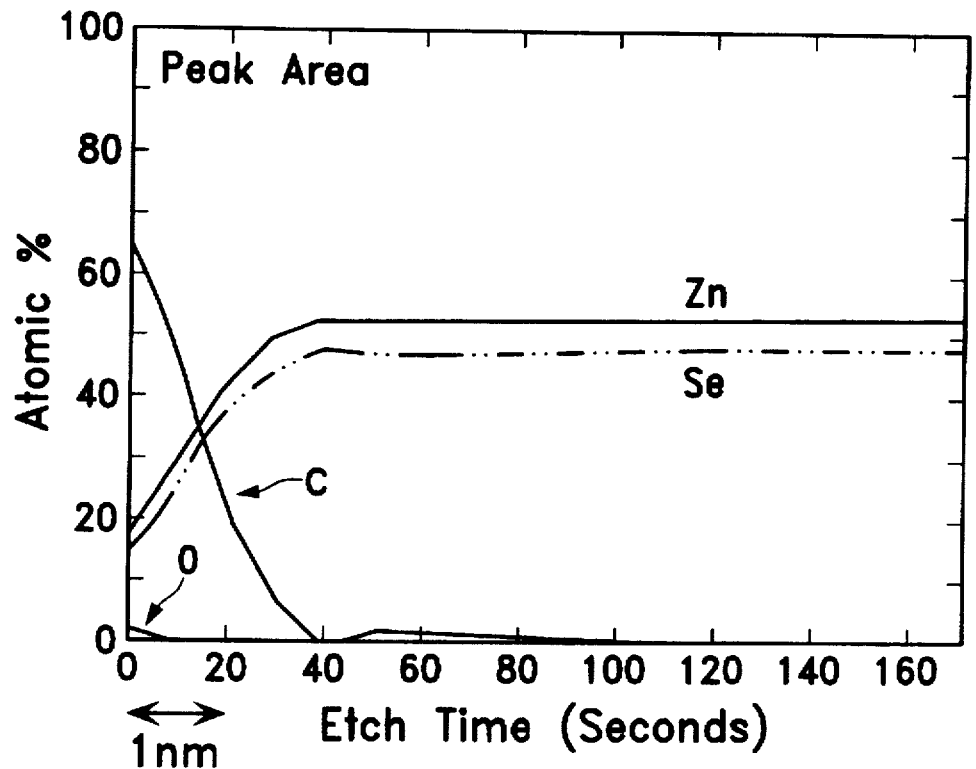
FIG. 12 is an AES in-depth profile taken from an undoped ZnSe epitaxial film cleaned by acetone solution.

FIG. 12 represents AES in-depth profiles taken from an undoped ZnSe epitaxial film cleaned by acetone solution. Carbon and oxygen are clearly observed within about 2 nm thicknesses from the surface of film. The AES analysis reveals that there exists a thin dielectric layer composed of oxygen and carbon on the ZnSe surface.

Figure 13:
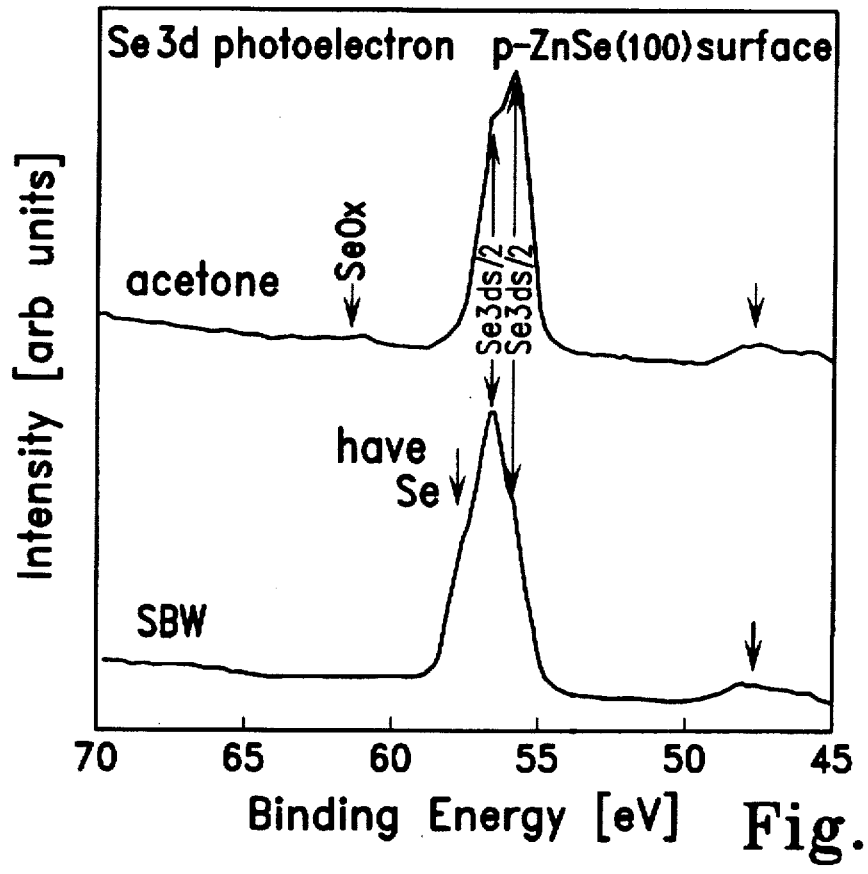
FIG. 13 is an X-ray photoemission spectra of Se $3d$ electrons for ZnSe epitaxial layers cleaned by acetone and etched by SBW.

FIG. 13 is X-ray photoemission spectra of Se 3d electrons for ZnSe epitaxial films cleaned by acetone solution (described simply as acetone surface) and SBW etching for 3 minutes (described as SBW surface). A weak Se 3d peak corresponding to the Se—O bond with a binding energy of 62 eV is observed on the acetone surface in FIG. 13, which gives the evidence of the existence of selenium oxide (which may be presumably $SeO_2$). A strong Se 3d peak corresponding to the ZnSe bond in FIG. 13 is constructed from multiple peaks of Se $3d_{3/2}$ with a binding energy of 56.9 eV and Se $3d_{5/2}$ with 56.2 eV. A broad peak in the lower energy side at 48 eV is due to the spin-orbit interaction between 3d electrons. It should be noted that the Se 3d peak related to the selenium oxide disappears on the SBW surface, indicating the removal of selenium oxide.

The present invention provides a blue light-emitting device with lower operating voltage than the devices using conventional electrode structures.

What we claim is:

1. A II–VI group compound semiconductor device comprising:

a $Zn_XMg_{1-X}S_YSe_{1-Y}$ ($0 \leq X \leq 1$, $0 \leq Y \leq 1$) semiconductor layer;

an intermediate layer formed on said semiconductor layer, wherein said intermediate layer comprises a compound, said compound comprising at least one of the elements constituting said semiconductor layer and an additive element being selected from the group consisting of Cd, Te, and Hg; and an electrode layer comprising Ni formed on said intermediate layer wherein said electrode layer comprises an intermetallic compound of Ni and said additive element contained in said intermediate layer.

2. A II–VI group compound semiconductor device comprising:

a $Zn_XMg_{1-X}S_YSe_{1-Y}$ ($0 \leq X \leq 1$, $0 \leq Y \leq 1$) semiconductor layer;

an intermediate layer formed on said semiconductor layer, wherein said intermediate layer comprises a compound, said compound comprising at least one of the elements constituting said semiconductor layer and an additive element being selected from the group consisting of Cd, Te, and Hg; and an electrode layer comprising Ni formed on said intermediate layer wherein said electrode layer comprises an intermetallic compound of Ni and said at least one of the elements constituting said intermediate layer.

3. A II–VI group compound semiconductor device comprising:

a $Zn_XMg_{1-X}S_YSe_{1-Y}$ ($0 \leq X \leq 1$, $0 \leq Y \leq 1$) semiconductor layer;

an intermediate layer formed on said semiconductor layer, said intermediate layer comprising a compound of at least one of the elements constituting said semiconductor layer and an additive element of Cd; and an electrode layer formed on said intermediate layer, said electrode layer comprising a metal selected from the group consisting of Ni and Pd, wherein said electrode layer comprises an intermetallic compound of said additive element constituting said intermediate layer and a metal selected from the group consisting of Ni and Pd.

4. A II–VI group compound semiconductor device comprising:

a $Zn_XMg_{1-X}S_YSe_{1-Y}$ ($0 \leq X \leq 1$, $0 \leq Y \leq 1$) semiconductor layer;

an intermediate layer formed on said semiconductor layer, said intermediate layer comprising a compound of at least one of the elements constituting said semiconductor layer and an additive element of Cd; and an electrode layer formed on said intermediate layer, said electrode layer comprising a metal selected from the group consisting of Ni and Pd, wherein said electrode layer comprises an intermetallic compound of an element constituting said semiconductor layer and a metal selected from the group consisting of Ni and Pd.

5. A II–VI group compound semiconductor device comprising:

a $Zn_xMg_{1-x}S_ySe_{1-y}$ ($0 \leq X \leq 1$, $0 \leq Y \leq 1$) semiconductor layer;

an intermediate layer formed on said semiconductor layer, wherein said intermediate layer comprises a compound, said compound comprising at least one of the elements constituting said semiconductor layer and an additive element being selected from the group consisting of Cd, Te and Hg; and an electrode layer comprising Ni, Pt and Pd, formed on said intermediate layer wherein said electrode layer comprises an intermetallic compound of at least one of the elements constituting said intermediate layer and a metal selected from the group comprising of Ni, Pt and Pd.

6. The semiconductor device as recited in claim 5, wherein said electrode layer further comprises an intermetallic compound of at least one of NiCd, NiHg, NiTe, PdCd, PdHg and PdTe.

7. The semiconductor device as recited in claim 5, wherein said additive element is Te and said electrode layer comprises Pd.

8. A II–VI group compound semiconductor device comprising:

a $Zn_xMg_{1-x}S_ySe_{1-y}$ ($0 \leq X \leq 1$, $0 \leq Y \leq 1$) semiconductor layer;

an intermediate layer formed on said semiconductor layer, wherein said intermediate layer comprises a compound, said compound comprising at least one of the elements constituting said semiconductor layer and an additive element being selected from the group consisting of Cd, Te and Hg; and an electrode layer comprising Ni, Pt and Pd, formed on said intermediate layer wherein said electrode layer comprises an intermetallic compound of at least one of the elements constituting said semiconductor layer and a metal selected from the group comprising of Ni, Pt and Pd.

9. The semiconductor device as recited in claim 8, wherein said electrode layer further comprises an intermetallic compound of Ni or Pd and said at least one of the elements consisting said semiconductor layer.

10. The semiconductor device as recited in claim 8, wherein said additive element is Te and said electrode layer comprises Pd.

11. A II–VI group compound semiconductor device comprising:

a $Zn_xMg_{1-x}S_ySe_{1-y}$ ($0 \leq X \leq 1$, $0 \leq Y \leq 1$) semiconductor layer;

an intermediate layer formed on said semiconductor layer, wherein said intermediate layer comprises a compound, said compound comprising at least one of the elements constituting said semiconductor layer and an additive element being selected from the group consisting of Cd, Te and Hg;

an intermetallic compound layer of at least one of the elements constituting said intermediate layer and a metal selected from the group consisting of Ni, Pt and Pd, formed on said intermediate layer; and an electrode layer comprising Ni, Pt and Pd, formed on said intermetallic compound layer.

12. The semiconductor device as recited in claim 11, wherein said intermetallic compound layer further comprises at least one of NiCd, NiHg, NiTe, PdCd, PdHg and PdTe.

13. The semiconductor device as recited in claim 11, wherein said additive element is selected from the group consisting of Cd, Te and Hg, and said electrode layer comprises Ni.

14. The semiconductor device as recited in claim 11, wherein said additive element is Cd, and said electrode layer comprises a metal selected from the group consisting of Ni and Pd.

15. The semiconductor device as recited in claim 11, wherein said additive element is Te and said electrode layer comprises Pd.

16. A II–VI group compound semiconductor device comprising:

a $Zn_xMg_{1-x}S_ySe_{1-y}$ ($0 \leq X \leq 1$, $0 \leq Y \leq 1$) semiconductor layer;

an intermediate layer formed on said semiconductor layer, wherein said intermediate layer comprises a compound, said compound comprising at least one of the elements constituting said semiconductor layer and an additive element being selected from the group consisting of Cd, Te and Hg;

an intermetallic compound layer of at least one of the elements constituting said semiconductor layer and a metal selected from the group consisting of Ni, Pt and Pd, formed on said intermediate layer; and an electrode layer comprising Ni, Pt and Pd, formed on said intermetallic compound layer.

17. The semiconductor device as recited in claim 16, wherein said intermetallic compound layer further comprises an intermetallic compound of Ni or Pd and said at least one of the elements consisting said semiconductor layer.

18. The semiconductor device as recited in claim 16, wherein said additive element is selected from the group consisting of Cd, Te and Hg, and said electrode layer comprises Ni.

19. The semiconductor device as recited in claim 16, wherein said additive element is Cd, and said electrode layer comprises a metal selected from the group consisting of Ni and Pd.

20. The semiconductor device as recited in claim 16, wherein said additive element is Te and said electrode layer comprises Pd.

* * * * *